(12) United States Patent
Wei et al.

(10) Patent No.: US 8,098,194 B2
(45) Date of Patent: Jan. 17, 2012

(54) DETERMINING CHARACTERISTICS OF A RADAR CROSS SECTION (RCS) TEST RANGE

(75) Inventors: Pax S. P. Wei, Sammamish, WA (US);
Anthony W. Reed, Seattle, WA (US);
Craig N. Ericksen, Renton, WA (US);
James D. Doty, Issaquah, WA (US);
Robert K. Schuessler, Covington, WA (US)

(73) Assignee: The Boeing Company, Chicago, IL (US)

( * ) Notice: Subject to any disclaimer, the term of this patent is extended or adjusted under 35 U.S.C. 154(b) by 76 days.

(21) Appl. No.: 12/577,418

(22) Filed: Oct. 12, 2009

(65) Prior Publication Data

US 2011/0084873 A1     Apr. 14, 2011

(51) Int. Cl.
*G01S 7/40* (2006.01)
(52) U.S. Cl. ........................................................ 342/165
(58) Field of Classification Search ........... 342/165–174
See application file for complete search history.

(56) References Cited

U.S. PATENT DOCUMENTS

| | | | |
|---|---|---|---|
| 4,901,080 A | 2/1990 | McHenry | |
| 5,075,681 A * | 12/1991 | Kartiala | 342/165 |
| 5,281,972 A * | 1/1994 | Jain | 342/25 F |
| 6,252,541 B1 * | 6/2001 | James | 342/165 |
| 6,744,400 B1 * | 6/2004 | Wei et al. | 342/165 |
| 7,498,977 B2 | 3/2009 | Wei et al. | |
| 2009/0033546 A1 | 2/2009 | Wei et al. | |

OTHER PUBLICATIONS

Knott, E.F. et al. "Broadside Radar Echoes From Wires and Strings." Microwave Journal, vol. 42, Horizon House, Jan. 1999, p. 102 et seq.
Knott, E.F. et al. "The Long String as a Field Probe." IEEE Antennas and Propagation Magazine, vol. 47, No. 6, Dec. 2005, pp. 22-27.
Sherman, W.D. et al. "Stereo Optical Tracker for Compact Range Models." Proc 14th AMTA, 1992, pp. 9-3-9-8.
Wei, P.S.P. "Study of DFT Windows for Radar Imaging." Proc. 17th AMTA, 1995, pp. 111-116.
Wei, P.S.P. et al. "Study of RCS Measurements from a Large Flat Plate." Proc. 27th AMTA, 2005, pp. 3-8.
Wei, P.S.P. et al. "Study of Wires and Strings of Finite Sizes." Proc. 20th AMTA, 221-226 (1998).
GB Intellectual Property Office, Combined Search and Examination Report for GB Application No. GB1017221.1 dated Feb. 7, 2011.

* cited by examiner

*Primary Examiner* — Timothy A Brainard
(74) *Attorney, Agent, or Firm* — Moore & Van Allen PLLC; Charles L. Moore

(57) ABSTRACT

A method for determining characteristics of a RCS test range may include vertically orienting a field probe including an elongated rigid body at a predetermined location within the RCS test range. The method may also include generating incident radar waves at a selected frequency and polarization and pivoting the field probe in a vertical direction broadside to the incident radar waves. The method may additionally include receiving return radar data scattered by the field probe during pivoting of the field probe. The method may further include determining a field distribution along the elongated rigid body of the field probe from the return radar data to determine characteristics of the RCS test range.

20 Claims, 10 Drawing Sheets

DETERMINING CHARACTERISTICS OF A RADAR CROSS SECTION (RCS) TEST RANGE

FIELD

The present disclosure relates to measuring the RCS of objects, such as aerospace vehicles or other vehicles, and test ranges for performing such RCS measurements, and more particularly to a system and method for determining a field distribution of a RCS test range.

BACKGROUND

A radar cross section (RCS) test range is a facility for measuring radar scattering properties of test objects, such as aerospace vehicles and other types of vehicles or objects. RCS test ranges provide a "quiet" test zone for measuring radar signature of a test object. The "quiet" test zone is an area within the test range where incident radar waves or signals are acceptably smooth in amplitude and phase and free from any undesired interference or unwanted reflections from elsewhere in or on the test range.

In a RCS test range, knowledge or information about the electromagnetic field distribution per frequency, per polarization, and as a function of location within the RCS test range is of importance in setting up scattering tests, data calibration, interpretation of results as well as other uses. Additionally, operating conditions of a test range can change over time. For example there can be changes in equipment, rearrangement of radar absorbers and other modifications that can alter expected operating conditions. Accordingly, it is considered good practice to probe the test zone or quiet test zone of the range at regular intervals or before new scattering test to ensure that radar fields within the test zone will behave as expected. Unfortunately, the time and equipment required for field probing can place additional cost burdens on test programs. However, without evaluating the characteristics of the RCS test range or quantifying the radar field distribution by probing the test range, the accuracy of actual RCS measurements of an object may be inaccurate or imprecise.

SUMMARY

In accordance with an embodiment, a method for determining characteristics of a RCS test range may include vertically orienting a field probe including an elongated rigid body at a predetermined location within the RCS test range. The method may also include generating incident radar waves at a selected frequency and polarization and pivoting the field probe in a vertical direction broadside to the incident radar waves. The method may additionally include receiving returned radar data scattered by the field probe during pivoting of the field probe. The method may further include determining a field distribution along the elongated rigid body of the field probe from the returned radar data to determine characteristics of the RCS test range.

In accordance with another embodiment, a method for determining characteristics of a RCS test range may include suspending an elongated vertical field probe at a predetermined location within the RCS test range. The elongated vertical field probe may be pivotable in a direction substantially parallel to a direction of travel of incident radar waves. The method may also include generating incident radar waves at a selected frequency and polarization. The elongated vertical field probe may be pivoted in the direction substantially parallel to the direction of travel of the incident waves. A distance of travel of a predetermined point on the elongated vertical field probe may be sensed from a zero degree vertical pivot angle as the elongated vertical field probe is pivoted through a predetermined range of motion. Returned radar information may be received from the elongated vertical field probe as the elongated vertical field probe is pivoted through the predetermined range of motion. Characteristics of the RCS test range may be determined based on the received returned radar information.

In accordance with another embodiment, a system for determining characteristics of a RCS test range may include a field probe having an elongated rigid body. The field probe may be vertically oriented at a predetermined location within the RCS range. The system may also include a device for pivoting the field probe in a vertical direction broadside to incident radar waves within the RCS range. The system may further include an apparatus for determining a field distribution along the elongated body of the field probe from returned radar data scattered by the field probe.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE SEVERAL VIEWS OF THE DRAWINGS

The following detailed description of embodiments refers to the accompanying drawings, which illustrate specific embodiments of the disclosure. Other embodiments having different structures and operations do not depart from the scope of the present disclosure.

DESCRIPTION

The following detailed description of embodiments refers to the accompanying drawings, which illustrate specific embodiments of the disclosure. Other embodiments having different structures and operations do not depart from the scope of the present disclosure.

Figure 1:
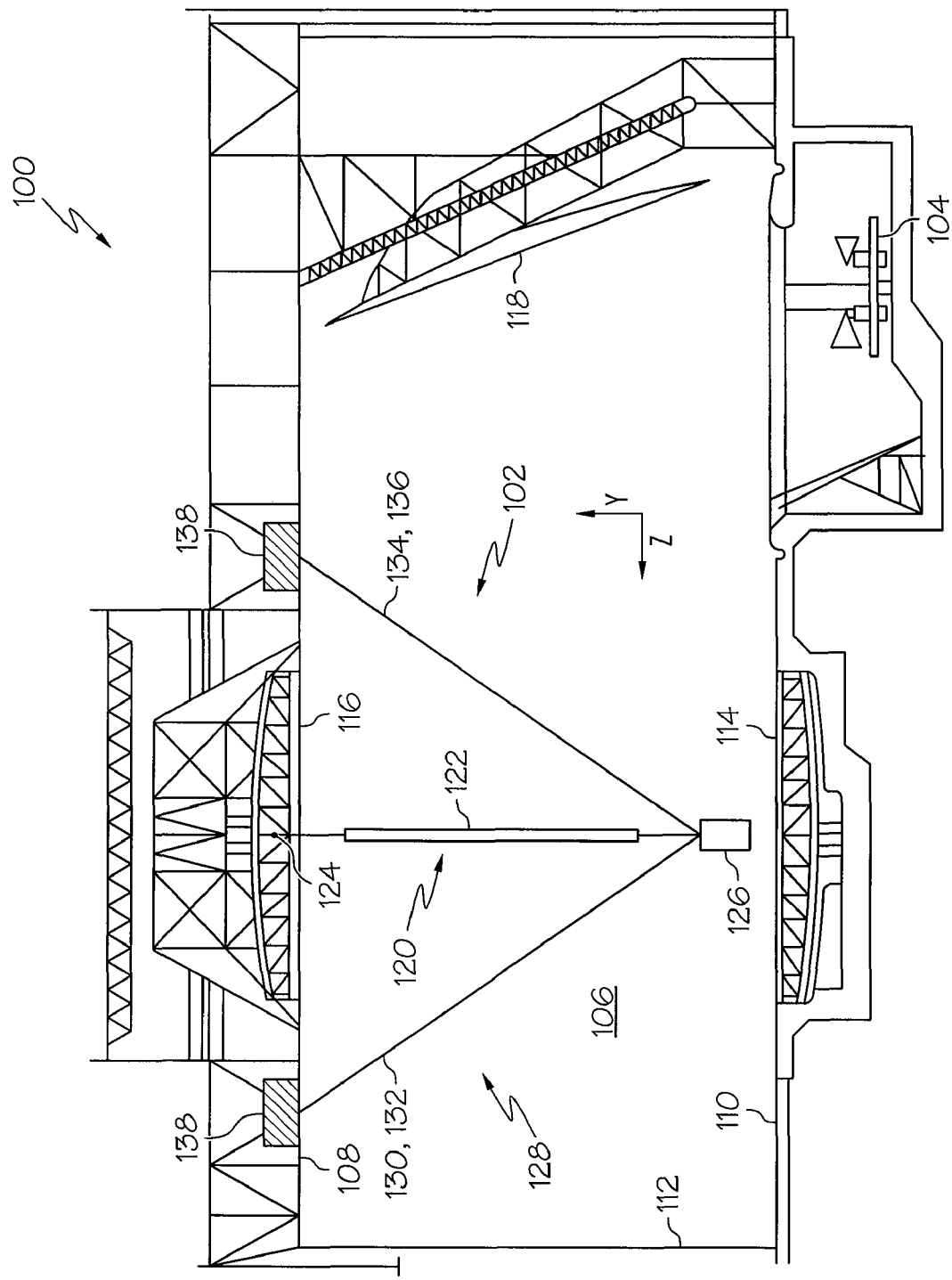
FIG. 1 is a cutaway side view of a RCS test range including an example of a system for determining characteristics of the RCS test range in accordance with an embodiment of the present disclosure.

FIG. 1 is a cutaway side view of an exemplary RCS test range 100 including an example of a system 102 for determining characteristics of the RCS test range in accordance with an embodiment of the present disclosure. The RCS test range 100 may include a radar system 104 for transmitting radar waves or radar signals at a predetermined frequency, pulse width, pulse repetition rate, scan pattern, and polarization into a test zone 106. The test zone 106 or quiet zone may be defined by the space within a ceiling 108, a floor 110, an end wall 112, and sidewalls (not shown) of the RCS test range 100. The floor 110 and ceiling 108 may each include a turntable 114 and 116, respectively, to provide motion for test objects. Although radar test range 100 is shown as an indoor range, radar test range 100 may be an outdoor range.

Test zone 106 is a space defined by a right-handed Cartesian coordinate system of x, y, and z-axes. The z-axis may extend from a main radar reflector 118 of radar system 104 to the end wall 112. The y-axis is orthogonal to the z-axis and extends between ceiling 108 and floor 110. The x-axis is orthogonal to the y and z-axes and extends out of the page of FIG. 1.

The system 102 for determining characteristics of the RCS test range 100 may include a vertically oriented field probe 120. The words "field probe" are used herein to represent any object that may be used for probing the field of the test range 100. The field probe 120 is vertically oriented or oriented parallel to the y-axis of the test zone 106. The vertically oriented field probe 120 may be located substantially at a mid-point of the of the test zone 106 between the main radar reflector 118 and the end wall 112 along the z-axis and between the sidewalls along the x-axis. The vertically oriented field probe 120 may also be positioned at some other predetermined location within the RCS test range 100 or test zone 106.

Figure 3:
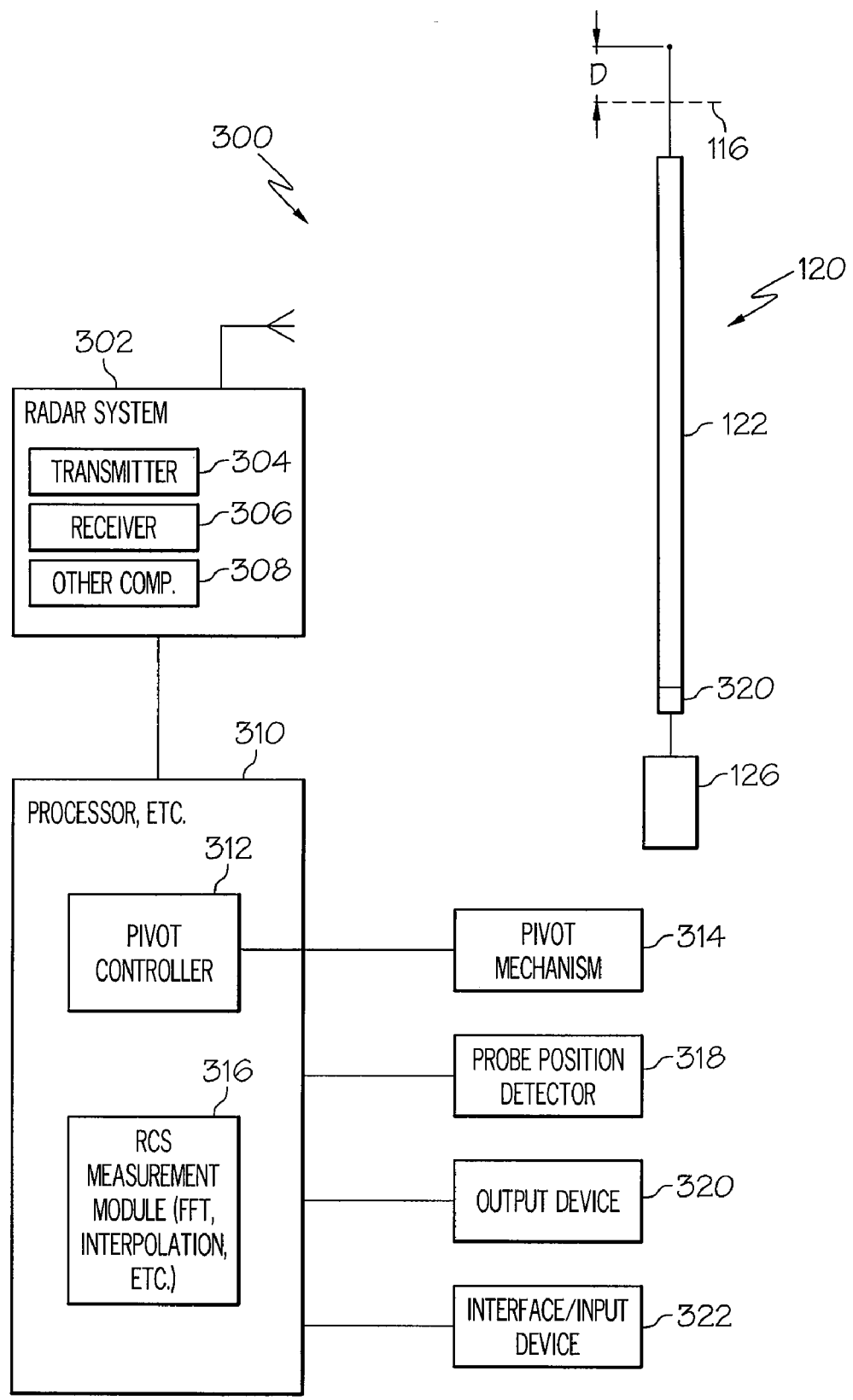
FIG. 3 is a block schematic diagram of an example of a system for determining characteristics of an RCS test range in accordance with an embodiment of the present disclosure.

The field probe 120 may include an elongated rigid body 122. The size or length of the elongate rigid body 122 may be determined by the size of the test zone 106 or height of the RCS test range 100 between the floor 110 and ceiling 108. The field probe 120 may be suspended from a pivot point 124 mounted on the ceiling 108 of the test range 100 or the pivot point 124 may be at a location above the ceiling. For example, the pivot point 124 for suspending the field probe 120 may be mounted a chosen distance "D" above the upper turntable 116 in the ceiling 108 as illustrated in FIG. 3.

In accordance with an exemplary embodiment, the vertically oriented field probe 120 may be a rope attached at one end to an elevated member or ceiling 108 of the RCS test range 100. A weight 126 may be attached to an opposite end of the rope to prevent the rope from flexing and to maintain the rope as a straight rigid body. At least a portion of the rope may define the vertically oriented field probe 120 including the elongated rigid body 122. A retro-reflective marker ring or similar device may be attached at a selected location on the rope for monitoring purposes and to track movement or pivoting of the field probe 120 using a Precision Optical Monitoring System (POMS) as described herein. Other types of devices or arrangements capable of accurately monitoring or measuring movement of the field probe to confirm uniform, steady movement thereof for collecting return or scattered radar data as described herein may also be used. The rope may be made of a dielectric material. While the field probe 120 of this embodiment is described as being a rope any similar item or arrangement having a similar shape and capable of returning scattered radar data or waves may be used.

In accordance with another exemplary embodiment, the field probe 120 may include an elongated metal rod, cylinder or other elongate structure. For example, the rod may be an Aluminum rod or the like. A rope or other suspending means may be attached to one end of the metal and to the pivot point 124 for pivotably suspending the elongated rod. A weight, such as weight 126, may be attached to an opposite end of the metal rod by a rope or other suitable attachment means. The ropes or other suitable attachment means will preferably have minimal effects on any return radar waves or signals scattered by the field probe 120.

A rope or other suitable attachment arrangement may also extend through the rod. One end of the rope may attach to an elevated member or the ceiling 108 of the RCS test range 100. An opposite end of the rope is attached to the weight 126 or other means. The weight facilitates maintaining the elongated rigid body 122 of the field probe 120 as the field probe 120 is pivoted or rotated through a predetermined angle or range of motion for probing the test zone 106 and determining the characteristics or field distribution of the test range 100. The elongated metal rod may be held or retained in a selected location between the one end of the rope and the weight 126 for scattering the incident radar waves.

Figure 2:
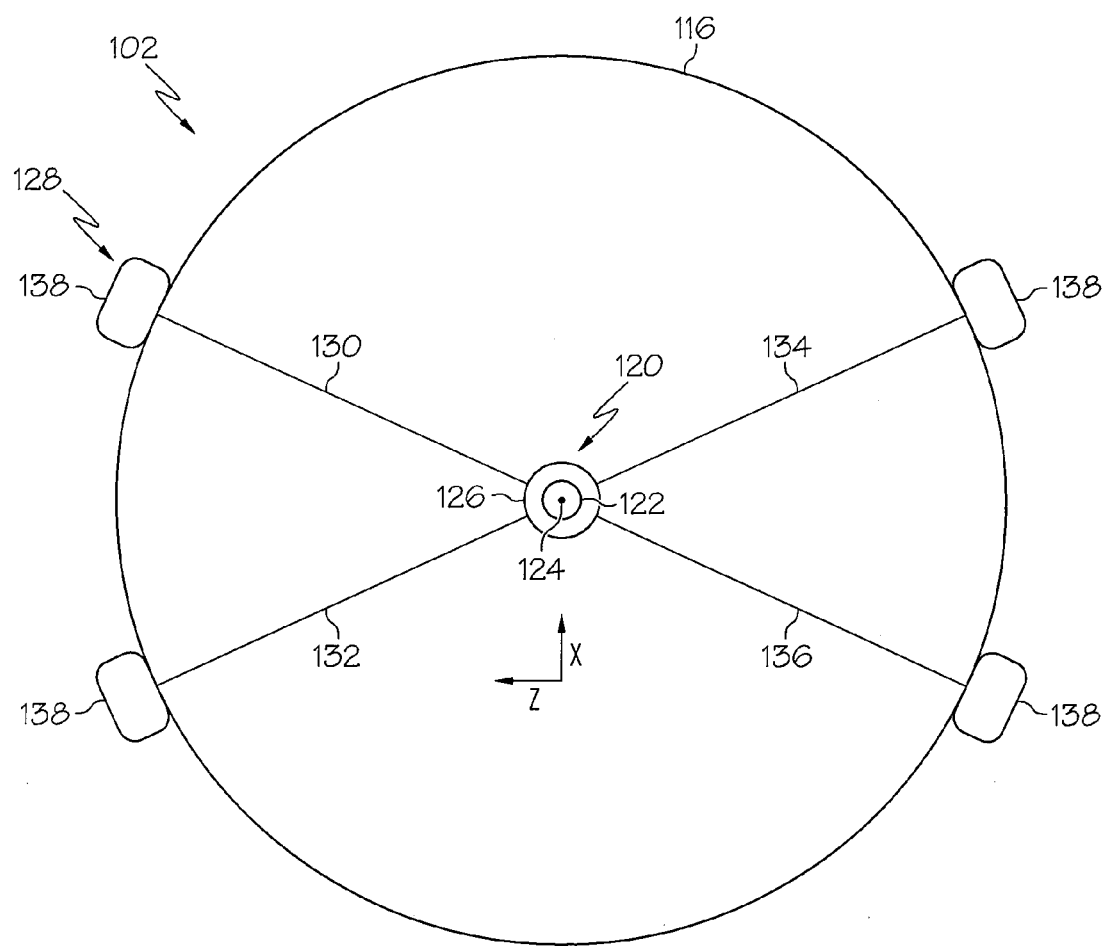
FIG. 2 is a top view of the exemplary system of FIG. 1 for determining characteristics of the RCS test range in accordance with an embodiment of the present disclosure.

The system 102 for determining characteristics of the RCS test range 100 may also include a device 128 or mechanism for pivoting the field probe 120 in a vertical direction broadside to incident radar waves or in a direction substantially parallel to a direction of travel of the incident radar waves within the RCS range 100. Referring also to FIG. 2, an example of a device 128 for pivoting the field probe 120 may include a first string 130 and a second string 132 attached to the weight 126 and extending from one side of the field probe 120. The device 128 also includes a third string 134 and a fourth string 136 attached to the weight 126 and extending from a opposite side of the field probe 120. Each of strings 130, 132, 134, and 136 may be attached to a respective winch 138, string reel or other arrangement to pivot or rotate the field probe 120 as described herein. The field probe 120 may be moved, pivoted or rotated in one direction (down-range or +Z direction) parallel to a direction of travel of the incident radar waves or broadside to the incident radar waves by pulling or reeling in the first and second strings 130 and 132 and extending, releasing or unreeling the third and fourth strings 134 and 136. Similarly, the field probe 120 may be pivoted or rotated in an opposite direction (up-range or −Z direction) parallel to the direction of travel of the incident radar waves by pulling or reeling in the third and fourth strings 134 and 136 and extending or unreeling the first and second strings 130 and 132. The strings 130, 132, 134, and 136 may be any type of material and weight that will not become broadside to the radar wave front so that they will not interfere or adversely affect measuring the field distribution of the field probe 120 for determining the characteristics of the RCS test range 120. Strings 130, 132, 134, and 136 are merely referred to as strings herein for purposes of describing the embodiment, although they may be ropes, cables or any other item capable of performing movement or pivoting of the field probe 120 for determining characteristics of the RCS test range 100 similar to that described herein.

FIG. 3 is a block schematic diagram of an example of a system 300 for determining characteristics of an RCS test range in accordance with an embodiment of the present disclosure. The system 300 may be used in the system 100 of FIG. 1. The system 300 may include a radar system 302. The radar system 302 may be the same or similar to the radar system 104 of FIG. 1. The radar system 302 may include a transmitter 304 for transmitting radar waves or signals and a receiver 306 for receiving return or scattered radar waves of signals from an object, such as the field probe 120 or other object under test for determining the RCS of the object. The radar system 302 may also include other components 308 for controlling the radar system 302, processing the radar signals as well as performing other functions associated with the radar system 302.

The system 300 may also include a processor 310. The processor 310 may include a pivot controller 312 for controlling a pivoting mechanism 314 for pivoting or rotation of the field probe 120. The pivoting mechanism may be similar to or the same as the device 128 for pivoting the field probe 120 in FIG. 1.

An RCS measurement module 316 may also be operable on the processor 310. The RCS measurement module 316 may embody portions of the method 400 described with reference to FIG. 4 for determining characteristics of the RCS test range 100. For example, the RCS measurement module 316 may include a unit for performing Fast Fourier Transforms and interpolating data points for re-sampling data similar to that described herein.

The system 300 may also include a probe position detector 318. The probe position detector may be a Precision Optical Monitoring System (POMS) or similar device for monitoring or tracking movement of the field probe as it is pivoted through a predetermined range of motion for determining the characteristics of the RCS range. A retro-reflecting marker ring 320 may be attached to a lower edge or portion of the field probe 120 to facilitate monitoring movement or pivoting of the field probe 120 by the POMS probe position detector 318.

The system 300 may also include an output device 320 for presenting data similar to that described herein including RCS data, characteristics of the RCS test range and other information. The output device or devices may include a monitor, printer, disk drives, or other output devices.

The system 300 may additionally include an interface or one or more input devices 322 for controlling operation of the system 300. The interface or input devices may include a keyboard, computer pointing device, such as a mouse or other apparatus.

Figure 4:
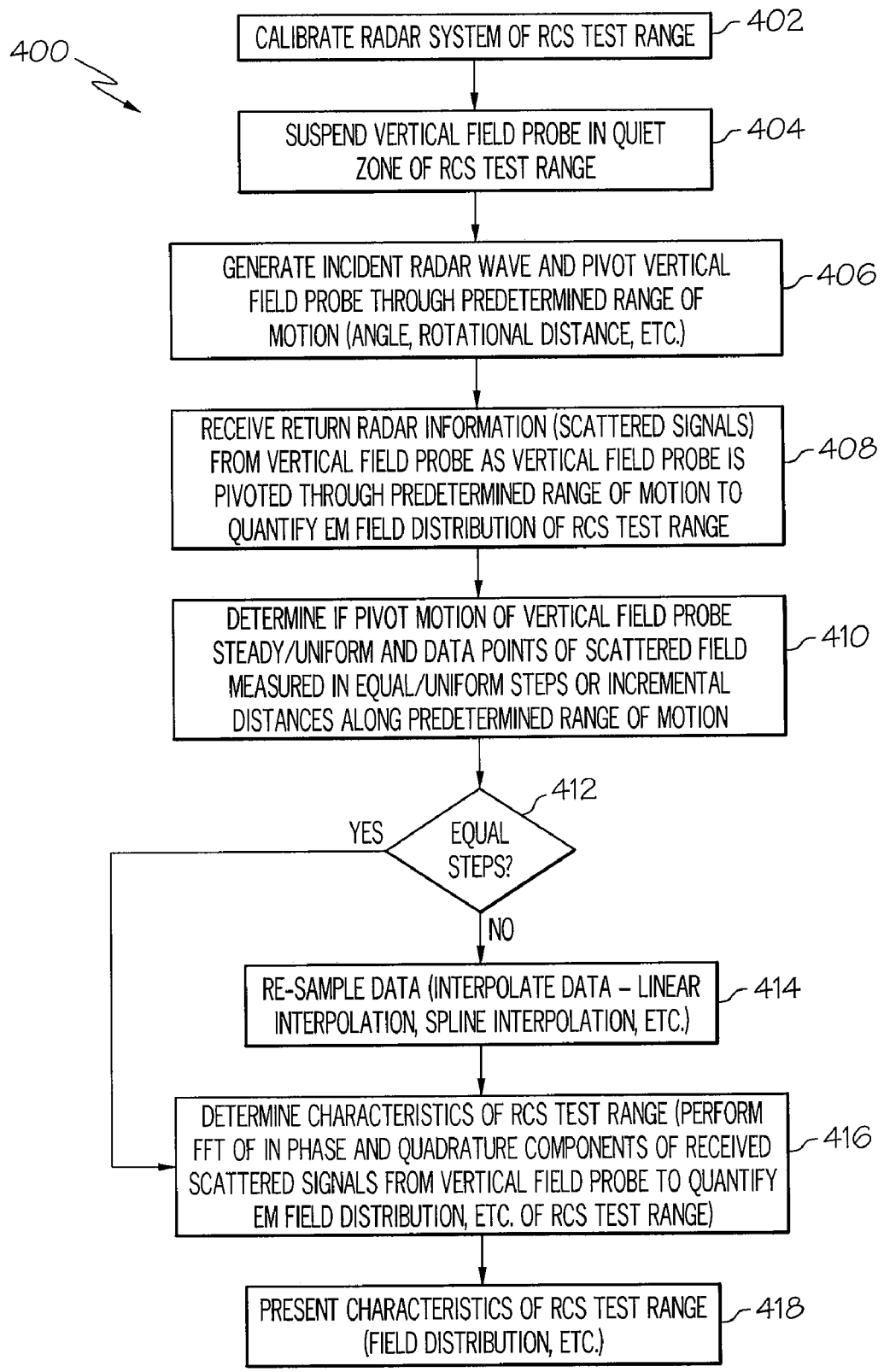
FIG. 4 is a flow chart of an example of a method for determining characteristics of an RCS test range in accordance with an embodiment of the present disclosure.

FIG. 4 is a flow chart of an example of a method 400 for determining characteristics of an RCS test range in accordance with an embodiment of the present disclosure. The method 400 may be embodied in and performed by the systems 100 and 300 of FIGS. 1 and 3. In block 402, the radar system of the RCS test range may be calibrated to confirm the system is in proper working order.

In block 404, a vertical field probe may be suspended in the quiet zone of the RCS test range similar to that previously described. In block 406, an incident radar wave may be generated having selected characteristics, such as a selected frequency, a selected polarization and other parameters selected by a user or operator. Also in block 404 the vertical field probe may be pivoted or rotated vertically through a predetermined range of motion, for example through a predetermined angle, rotational distance or the like. As previously described, the field probe is rotated or pivoted in a vertical direction broadside to the incident radar waves or in a direction parallel to the direction of travel of the incident radar waves. The field probe may be pivoted through a predetermined angle from a vertical broadside position to the incident radar waves to translate the field probe a selected distance up-range (−Z) and down-range (+Z) in the RCS test range, such as range 100 of FIG. 1. The predetermined angle may be about ±5 degrees from vertical.

A distance of travel of a predetermined point on the elongated field probe may be sensed from a zero degree vertical pivot angle as the elongated vertical field probe is pivoted through the predetermined range of motion or predetermined angle.

In block 408, return radar data or information may be received. The return radar data includes scattered signals or waves from the vertical field probe as the vertical field probe is pivoted through a predetermined range of motion or angle to quantify the electromagnetic field distribution of the RCS test range.

In block 410, a determination may be made if the pivot motion of translation of the vertical field probe was uniformly smooth or steady. In other words, were the data points of the scattered field measured in equal/uniform steps or incremental distances along the predetermined range of motion. An example of a procedure for determining if the pivot motion was uniformly smooth or steady and the data points collected or measured in equal or uniform steps or distances will be described with reference to FIG. 7. The motion monitored or tracked by the POMS or other movement measurement means may be used to determine if the movement was uniformly smooth and data gathered in equal steps.

In block 412, a determination may be made if the pivot motion of the field probe was uniformly smooth and steady and the data points of the return or scattered radar wave were collected in equal steps or distance of translation of the field probe. If the pivot motion of the field probe was uniformly smooth or steady, the method 400 may advance to block 416. If the pivot motion was not smooth or steady, the method 400 advances to block 414. In block 414, the return or scattered radar data may be re-sampled to provide data in uniform steps or equivalent distances of translation or movement of the field probe. The data may be re-sampled by interpolation using linear interpolation or spline interpolation. Spline interpolation was generally found to provide more accurate results.

In block 416, characteristics of the RCS test range may be determined. The characteristics may be determined by performing Fast Fourier Transforms (FFT) of in phase and quadrature components of the received return or scattered waves or signals from the vertical field probe. A field distribution along the elongated rigid body of the field probe may be determined by performing the FFT of the return radar data.

In block 418, the characteristics of the RCS test range including the field distribution along the field probe and other measurements may be presented. FIGS. 5-14 are examples of different data that may be determined and presented to a user or operator.

Figure 5:
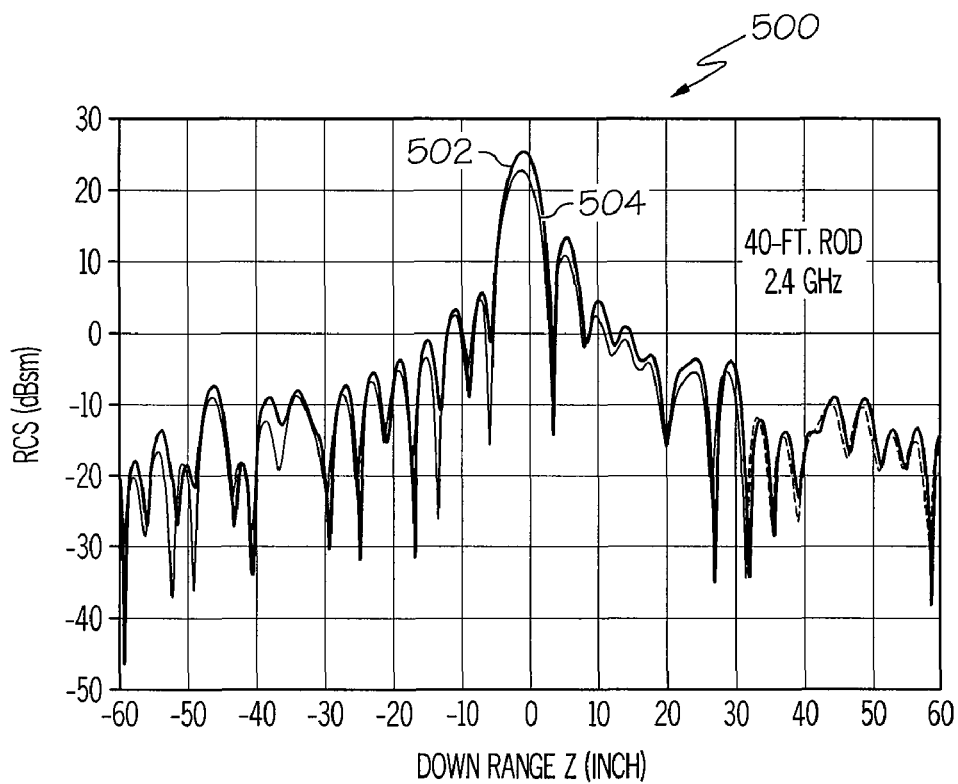
FIG. 5 is an illustration of RCS or return radar data scattered by a field probe based on down-range movement of the field probe in accordance with a further embodiment of the present disclosure.

FIG. 5 is an illustration of waveforms 500 of RCS or return radar data scattered by a field probe based on down-range movement of the field probe in accordance with an embodiment of the present disclosure. The exemplary field probe for the waveforms 500 or RCS patterns measured and illustrated in FIG. 5 was an Aluminum rod 40 feet in length and with a diameter of 4 inches. A retro-reflecting marker ring was attached to a lower edge of the rod to facilitate monitoring or tracking the movement of the rod by POMS as the rod was pivoted or rotated in a direction parallel to the direction of travel or broadside to the incident radar waves or signals. The field probe or 40 foot rod was pivoted or rotated in a manner similar to that previously described with reference to FIGS. 1 and 2 by pulling on lines or strings 130 and 132 while releasing lines or strings 134 and 136 and reversing this to pivot the field probe in the opposite direction. The field probe was pivoted or rotated over a predetermined range of motion of between about Z=+65 inches and about Z=−65 inches over a time period of about 3 minutes. This range of motion along the Z axis corresponds to a pivot angle or angle of inclination of about ±5 degrees. The straight vertical position directly broadside to the incident radar wave is at Z=0 inches on the abscissa or horizontal axis in FIG. 5. The ordinate or vertical axis is RCS in decibels square meter (dBsm). The incident radar wave for the results illustrated in FIG. 5 had a frequency of 2.4 GHz and measurements or RCS patterns were taken for both vertical polarization VV 502 and horizontal polarization HH 504.

Figure 6:
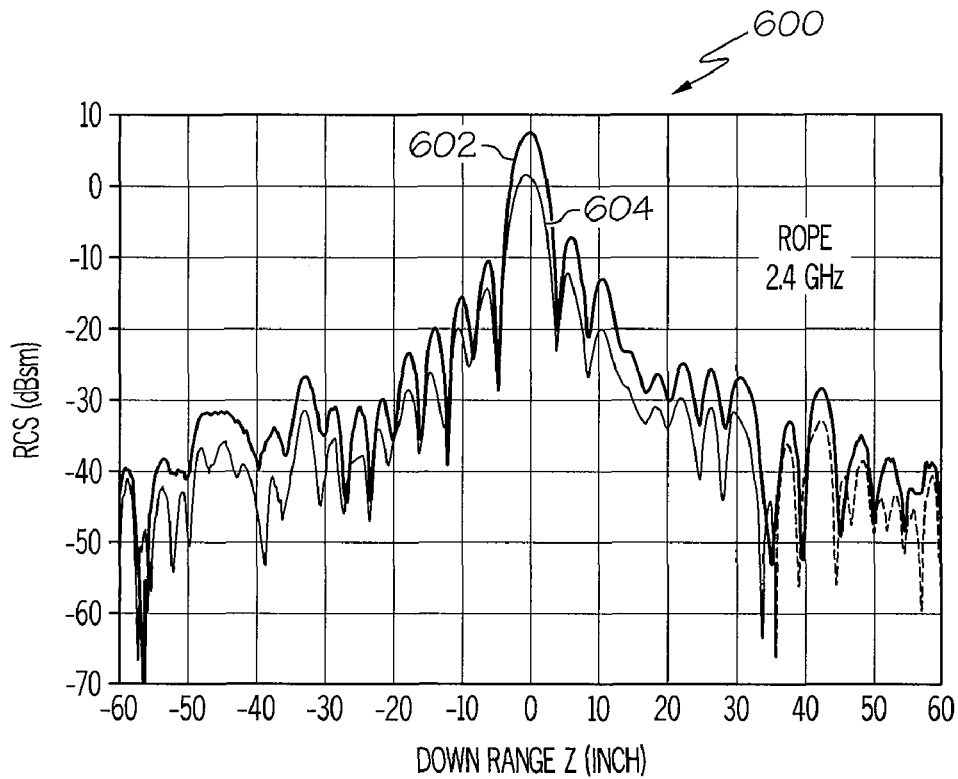
FIG. 6 is an illustration of RCS or return radar data scattered by a field probe based on down-range movement of the field probe in accordance with another embodiment of the present disclosure.

FIG. 6 is an illustration of waveforms 600 or return radar data scattered by a field probe based on down-range movement of the field probe in accordance with another embodiment of the present disclosure. The exemplary field probe for the example illustrated in FIG. 6 was a multi-stranded dielectric rope having a diameter of about ¾ inches. The test set up was similar to that described with reference to FIGS. 1 and 2 and the field probe or rope was rotated or pivoted in the same manner as described with reference to FIGS. 1 and 2. Similar to FIG. 5, the RCS patterns shown in FIG. 6 are for an incident radar wave of 2.4 GHz and measurements were taken for both the vertical polarization VV 602 and horizontal polarization HH 604.

Figure 7:
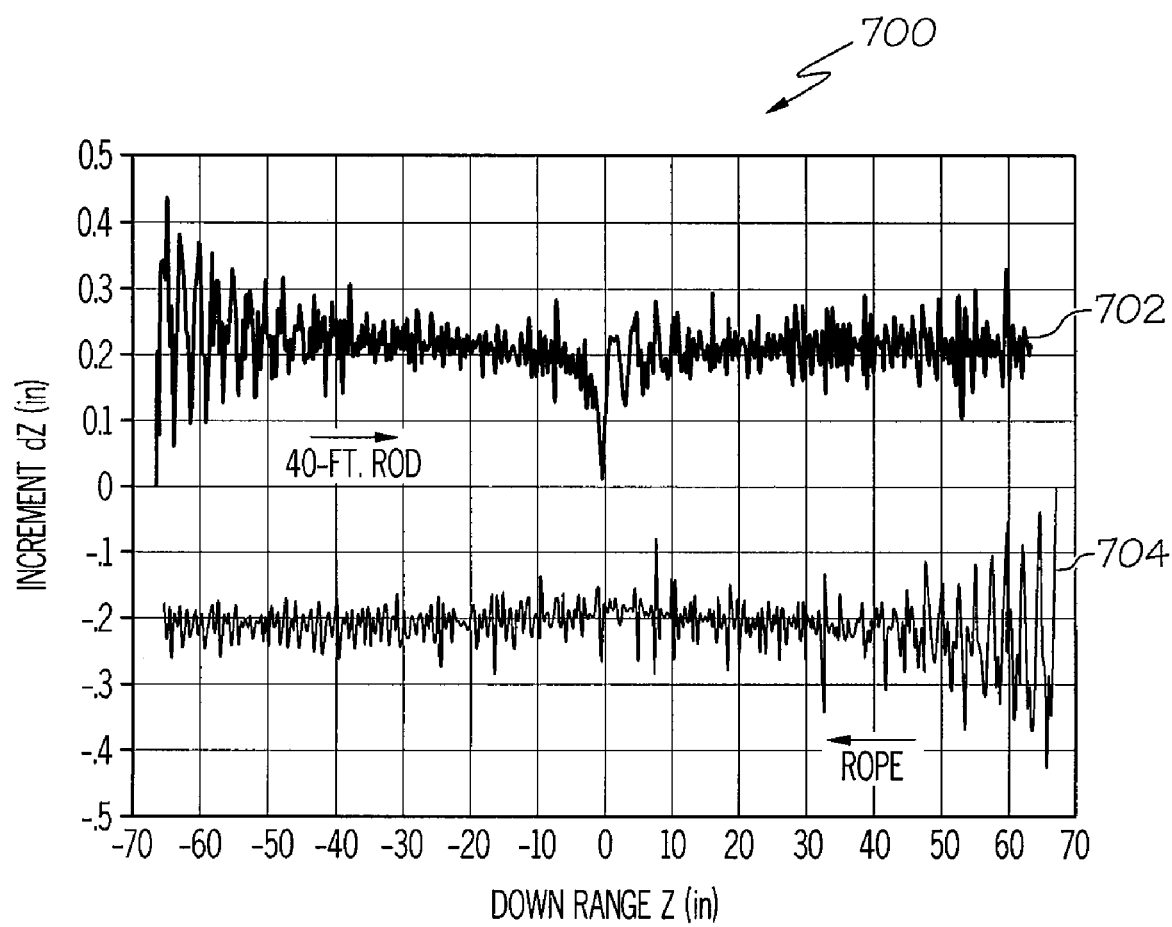
FIG. 7 is an illustration of detected motion of a field probe for determining uniformity or steadiness of movement of the field probe in accordance with an embodiment of the present disclosure.

FIG. 7 is an illustration of graphs 700 of detected motion of the exemplary field probes for determining uniformity or steadiness of movement of the field probes in accordance with a further embodiment of the present disclosure. The upper graph 702 is for the 40-foot Aluminum rod field probe and the lower graph 704 is for the dielectric rope. As previously discussed, a retro-reflective marker was attached to a lower end of each field probe and the 3-dimensional motion of each rod was monitored or tracked using POMS. Although, any suitable arrangement for accurately monitoring or tracking movement of the field probe may be used.

In order for the Fast Fourier Transform (FFT) algorithm to work properly, the data points should be spaced at equal steps. Otherwise, the FFT spectrum might be arbitrary. If the data points were not measured in equal steps, the raw data may be re-sampled at equal steps. In reviewing the waveforms 702 and 704 in FIG. 7 it is apparent that the RCS patterns shown in FIGS. 5 and 6 were measured at irregular steps with respect to the down-range distance Z.

Figure 8:
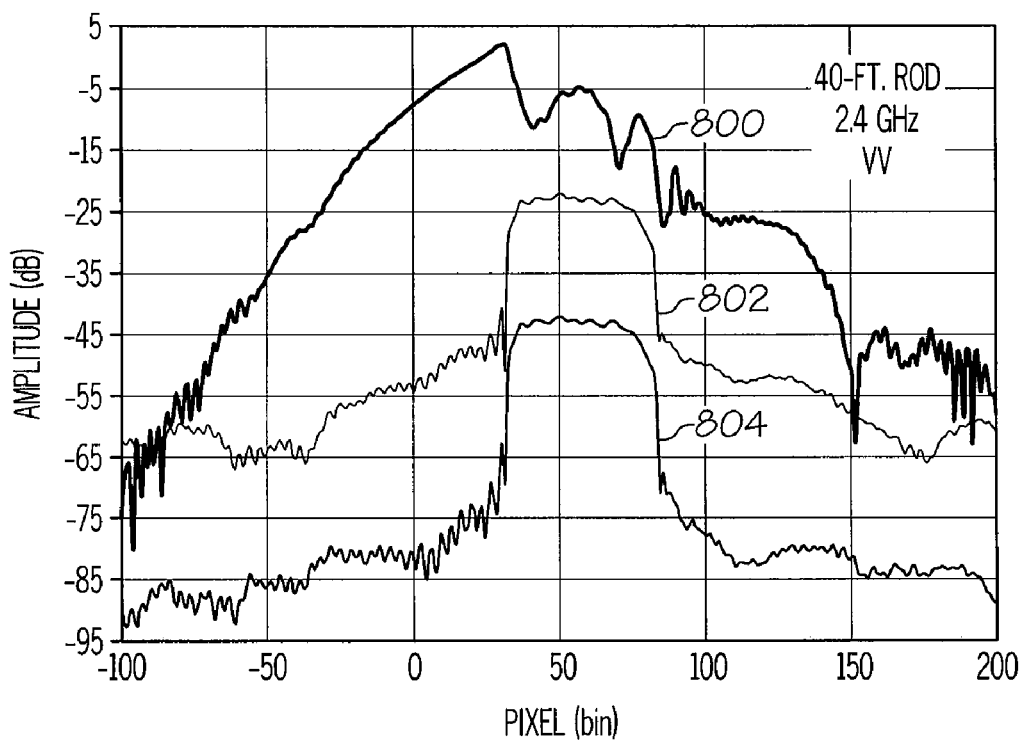
FIGS. 8 and 9 are each an illustration of a Fast Fourier Transform of raw return radar data and re-sampled data for respective exemplary field probes in accordance with an embodiment of the present disclosure.
Figure 9:
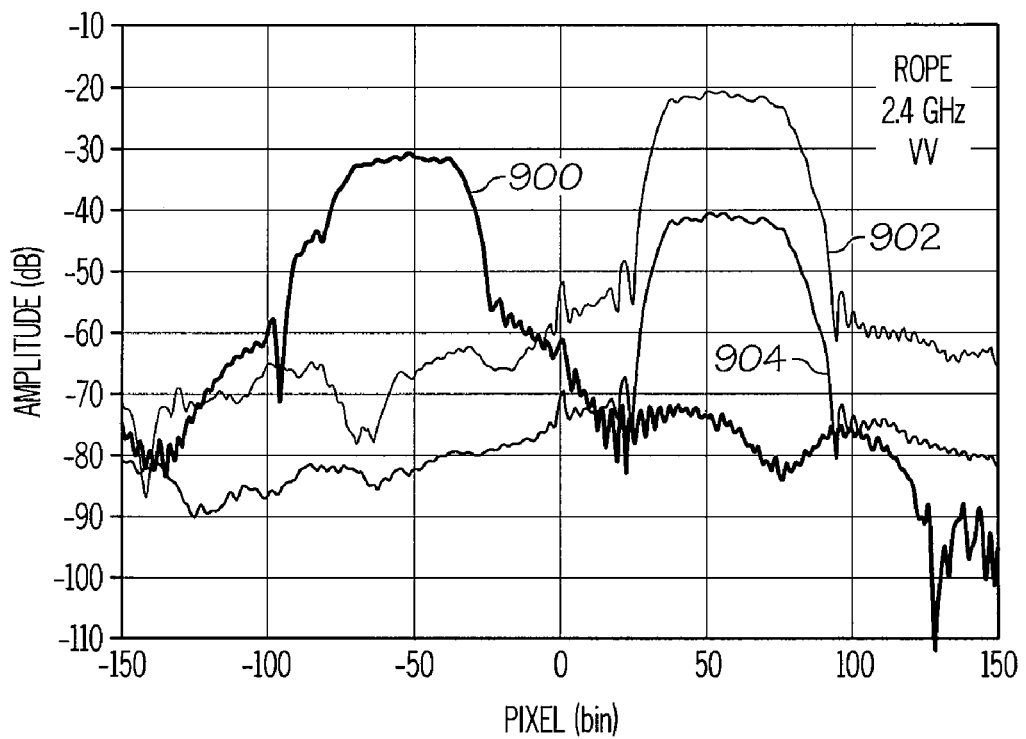

FIG. 8 is an illustration of an example of a FFT of raw return radar data 800 and re-sampled data 802 and 804 for the exemplary Aluminum rod field probe in accordance with an embodiment of the present disclosure. FIG. 9 is an illustration of an example of a FFT of raw return radar data 900 and re-sampled data 902 and 904 for the exemplary dielectric rope field probe in accordance with an embodiment of the present disclosure. In FIGS. 8 and 9, the FFT spectra obtained from the raw data 800 and 900 was measured for each field probe embodiment at 2.4 GHz with the polarization VV. Due to the irregular sampling steps in Z, as determined from motion graphs 702 and 704 in FIG. 7, the resultant FFT spectra are quite arbitrary. Accordingly, a re-sampling of the raw data may be performed in predetermined regular steps to obtain data in uniform or equal steps for performing the FFT. In the examples illustrated in FIGS. 8 and 9, the raw data was re-sampled in regular steps of 0.200 inch (in increasing Z from −60 to 60 inches). The re-sampling may be performed by interpolation of the data or by another suitable process to provide data at regular intervals. One interpolation method that may be used is linear interpolation using two nearest neighbors for each Z position. The re-sampled data using the linear interpolation for the Aluminum rod field probe is waveform 802 in FIG. 8. The re-sampled data using the linear interpolation for the dielectric rope field probe is waveform 902 in FIG. 9.

Another interpolation method that may be used is spline interpolation using four data points on each side of a prospective Z position by a $3^{rd}$ order polynomial (also known as cubic spline fit). The re-sampled data using the spline interpolation for the Aluminum rod field probe is waveform 804 in FIG. 8. The re-sampled data using the spline interpolation for the dielectric rope field probe is waveform 904 in FIG. 9. The amplitudes of the waveforms for the Aluminum rod field probe have been offset by −20 dB for the linear interpolation waveform 802 and by −40 dB for the spline interpolation waveform 804 for ease of viewing the waveforms. Similarly, the raw data waveform 900 and the spline interpolation waveform 904 have been offset by −10 dB and −20 dB respectively in FIG. 9 for ease of viewing the waveforms.

Each of the re-sampled or interpolated waveforms 802, 804, 902 and 904 exhibit a plateau near the central pixels at about 40 dB above the background noise. Additionally, the spline interpolation waveforms 804 and 904 appear to exhibit more or better fine structures than the linear interpolation waveforms 802 and 902.

Figure 10:
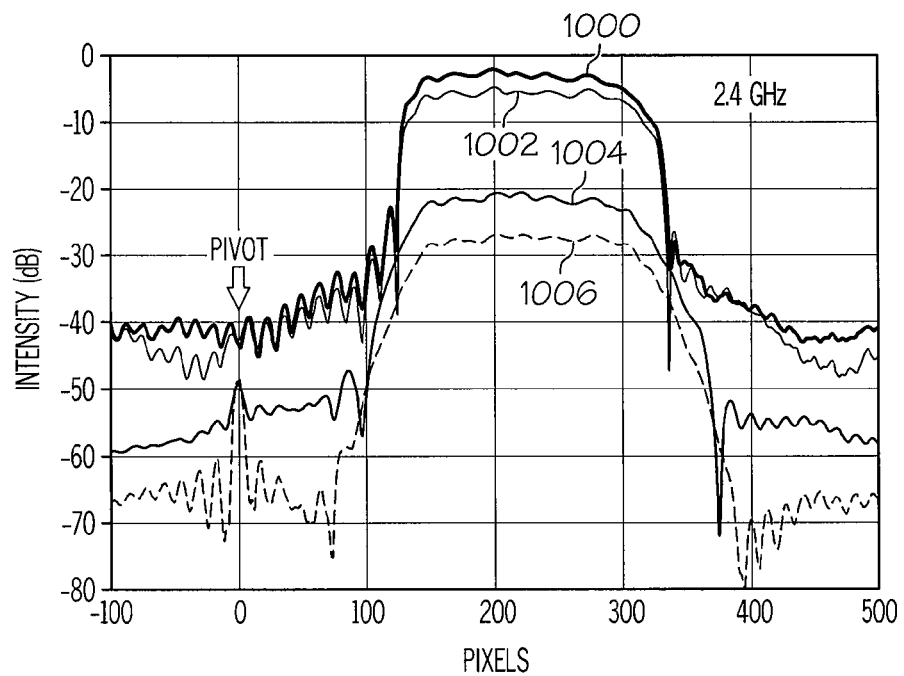
FIG. 10 is an illustration of a Fast Fourier Transform showing intensity versus pixels for calibration of a vertical Y distance for an exemplary field probe in accordance with an embodiment of the present disclosure.

FIG. 10 is an illustration of FFT spectra or waveforms showing intensity versus pixels for calibration of a vertical Y distance for the exemplary field probes in accordance with the embodiments of the present disclosure. The FFT spectra for the Aluminum rod field probe are waveform 1000 for the vertical polarization and waveform 1002 for the horizontal polarization. The FFT spectra for the dielectric rope are waveform 1004 for the vertical polarization and waveform 1006 for the horizontal polarization in FIG. 10.

Figure 11A:
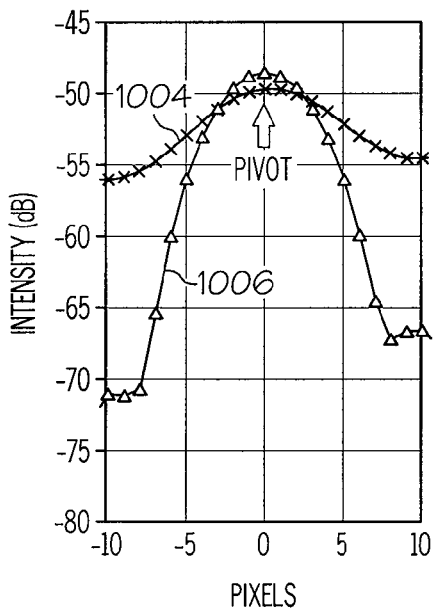
FIG. 11 includes illustrations of expanded plots of selected features of the waveforms in FIG. 10 for the calibration of the distance Y in the vertical orientation in accordance with an embodiment of the present disclosure.
Figure 11B:
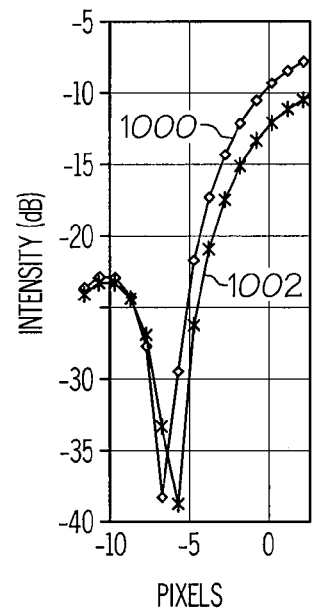
Figure 11C:
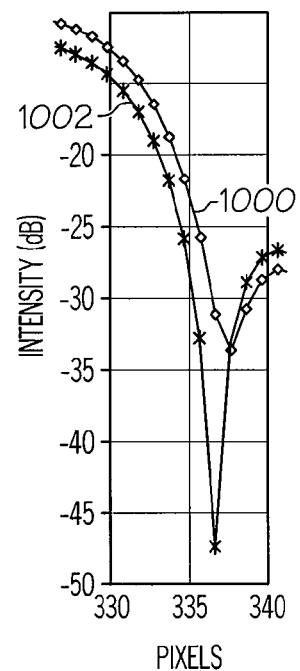

FIG. 11 includes illustrations of expanded plots of selected features of the waveforms or spectra in FIG. 10 for the calibration of the distance Y in the vertical orientation in accordance with the embodiment of the present disclosure. In FIG. 10, the spectra for the 40-ft rod 1000 and 1002 exhibit sharp cut-offs which would facilitate the calibration from pixel number to the vertical distance in Y. The spectra for the dielectric rope 1004 and 1006 are of lower intensity, which allows the zero-pixel peak to stand out among the side-lobes to be reckoned as the pivot of rotation.

In FIG. 11, the zero-pixel peak and the two cutoffs from FIG. 10 have been selected for expanded plots. In the three panels of FIG. 11, it should be noted that there are different scales in both ordinate and abscissa. The individual FFT points are denoted by symbols superimposed on the curve for better viewing. Though there are many FFT-window functions which may provide different main-lobe width versus trade-off on side-lobe suppression, the box-car option (or no window) has been chosen for the best resolution. The point-response function for the box-car is the $[\sin(X)/X]^2$, called the sinc function, which has its first side-lobe at −13.26 dB down from the main peak. On the cutoffs, the half-width points at −13 to −15 dB down from the respective plateaus are designated by short bars. The choices on where to count as the end points for the 40-ft rod would give rise to an uncertainty (or finite error) in Y by ±2.30 [inch per point].

Figure 12:
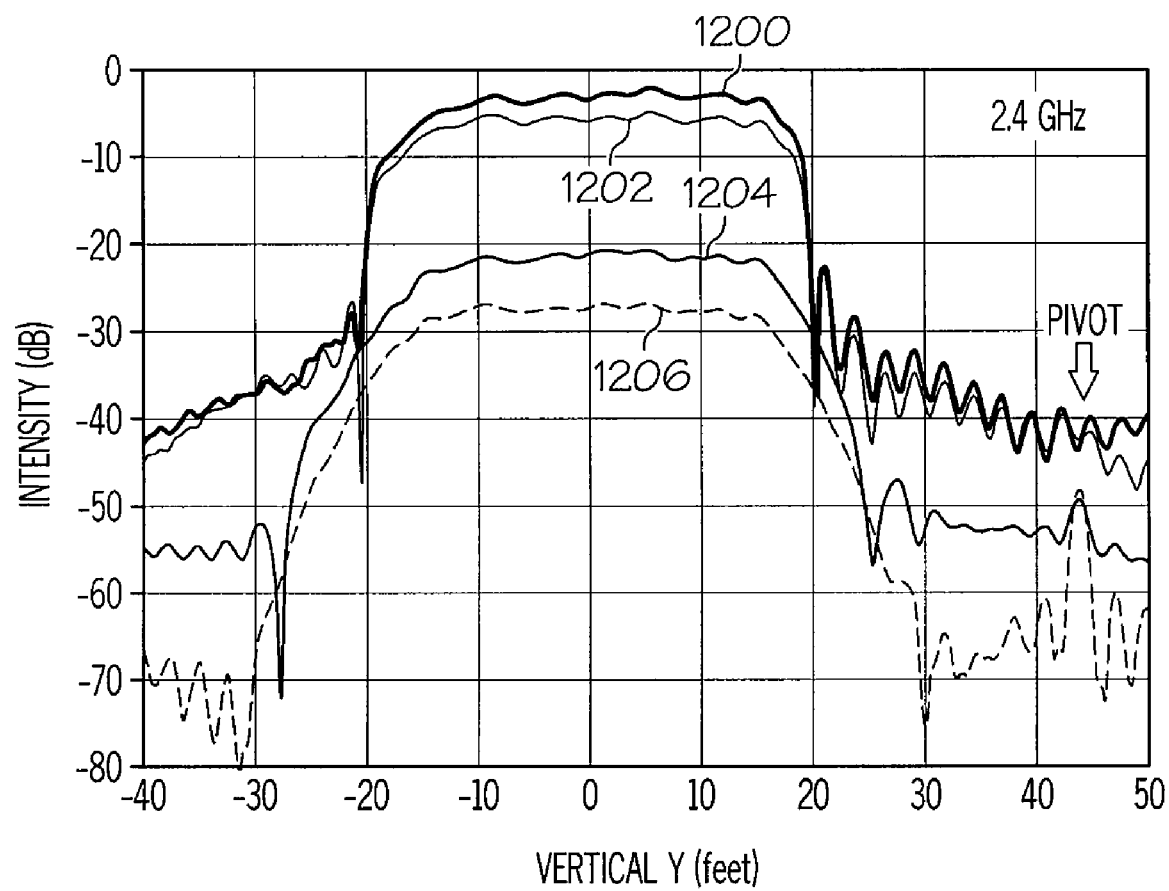
FIG. 12 is an illustration of a Fast Fourier Transform showing intensity versus calibrated Y distance for the exemplary field probe in accordance with an embodiment of the present disclosure.

FIG. 12 is an illustration of the FFT spectra showing intensity versus calibrated Y distance for each of the exemplary field probes in accordance with the embodiments of the present disclosure. The spectra or waveforms for the 40-ft rod field probe are waveform 1200 for the vertical polarization and waveform 1202 for the horizontal polarization. The spectra or waveforms for the dielectric rope are waveform 1204 for the vertical polarization and waveform 1206 for the horizontal spectra. In FIG. 12, the same data at 2.4 GHz (used in FIG. 10) are re-plotted as a function of the abscissa in the calibrated vertical distance Y (in feet). The ripples across the plateau represent the variation in field as sampled by the vertical objects by their small angular motions in a plane containing the YZ-axes. While the 40-ft rod showed abrupt cutoffs, the dielectric rope by its nearly floor-to-ceiling length (<80 ft) would actually sample the field tapered much beyond the nominal quiet zone boundary (centered at Y=0.0) of ±14 ft in the vertical dimension. Except for some minor difference, the field distributions within ±14 feet from the center are qualitatively similar as sampled from the two objects or exemplary field probes, and for each of the two polarizations.

Figure 13:
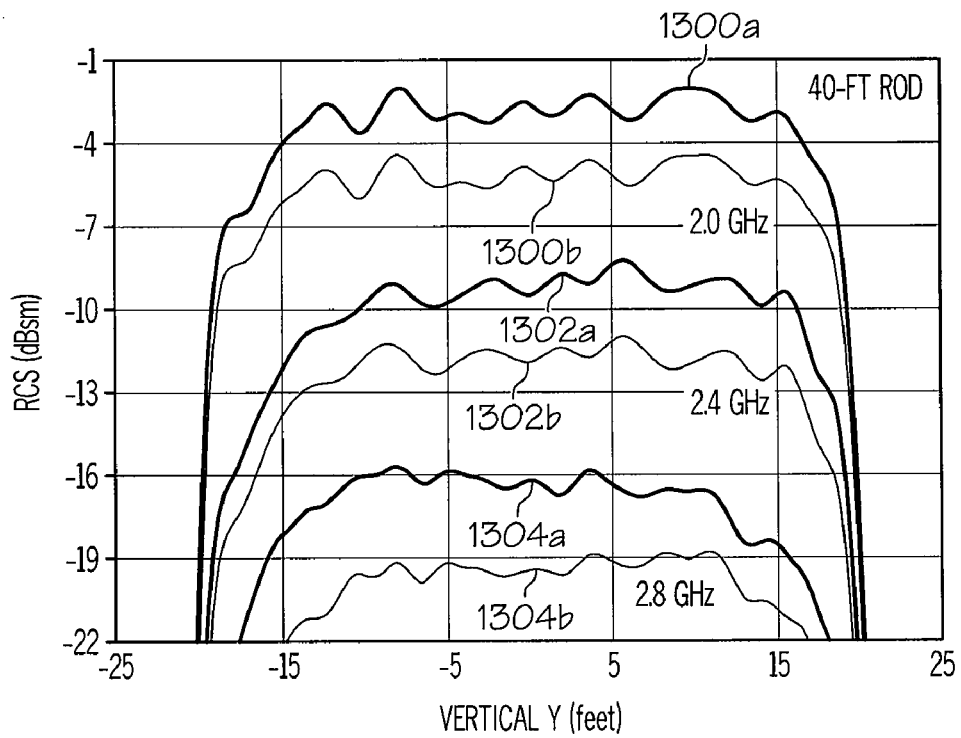
FIGS. 13 and 14 are illustrations of the RCS or field distribution along respective exemplary field probes in accordance with embodiments of the present disclosure.
Figure 14:
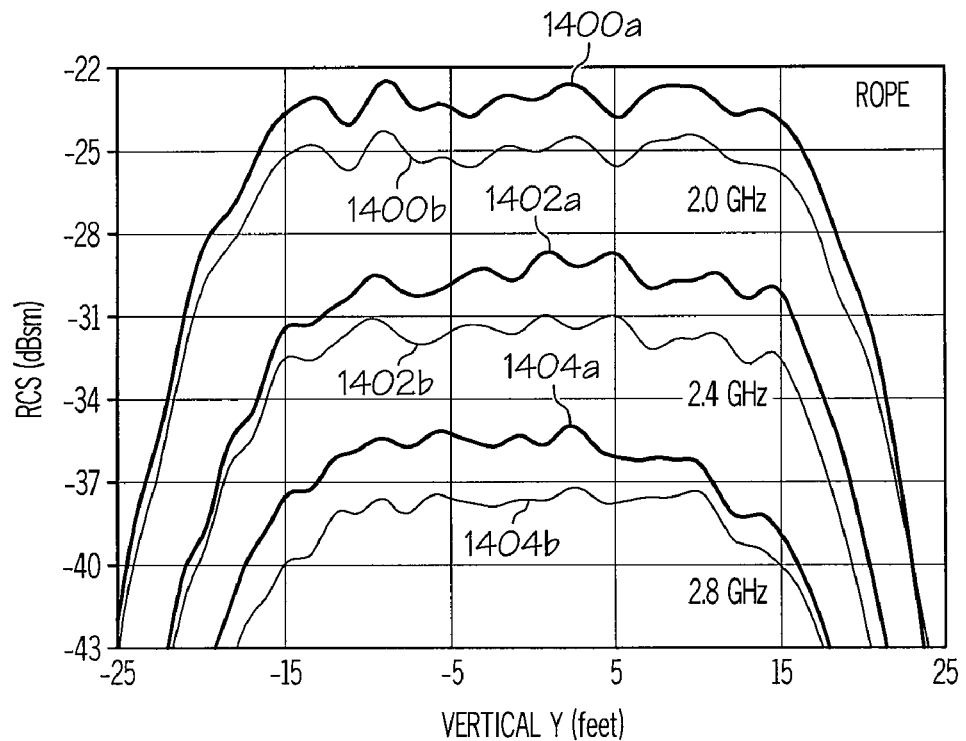

FIGS. 13 and 14 are illustrations of the RCS or field distribution along the respective exemplary field probes in accordance with embodiments of the present disclosure. FIG. 13 shows illustrations of the RCS or field distribution along the 40-ft rod field probe example measured for incident waves at frequencies of 2.0 GHz 1300a and 1300b, 2.4 GHz 1302a and 1302b, and 2.8 GHz 1304a and 1304b in both vertical (upper waveform 1300a-1304a for each frequency) and horizontal polarizations (lower waveforms 1300b-1304b for each frequency).

FIG. 14 shows illustrations of the RCS or field distribution along the dielectric rope field probe example measured for incident waves at frequencies of 2.0 GHz 1400a and 1400b, 2.4 GHz 1402a and 1402b, and 2.8 GHz 1404a and 1404b in both vertical (upper waveform 1400a-1404a for each frequency) and horizontal polarizations (lower waveforms 1400b-1404b for each frequency).

In FIGS. 13 and 14, the results of the field distributions can be compared at three frequencies obtained by the two exemplary field probes plotted with the same scales. The abscissas are Y-distance in 10 feet per division. The ordinates are in 3-dB per division, which was calibrated to the [dBsm] scale for the 2.0-GHz vertical polarization VV-case only. The vertical polarization VV traces for the 2.4 and 2.8 GHz are each shifted down by −6 dB from the previous VV trace.

In FIG. 13, the horizontal polarization HH traces are each shifted down by −2 dB from the respective vertical polarization VV at the same frequency. In FIG. 14, since the HH scattering from the dielectric rope is −6 dB weaker than the corresponding VV, the HH traces are shifted up by 4 dB each from the respective VV, so as to match the appearance of FIG. 13.

An important observation is that the field distribution is sensitive to the change in frequency. Aside from the end effects outside of ±14 feet, the field distribution is very similar whether it has been obtained from an object of strong (metal rod) or moderate (dielectric rope) scattering. Except the different dB scales, the resemblance between the waveforms is quite remarkable when comparing them curve by curve, wiggle by wiggle, per frequency, and per polarization.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. A method for determining characteristics of a RCS test range, comprising:
    vertically orienting a field probe including an elongated rigid body at a predetermined location within the RCS test range, wherein the vertically oriented field probe is free at one end to pivot;
    generating incident radar waves at a selected frequency and polarization;
    pivoting the field probe in a vertical direction broadside to the incident radar waves;
    receiving return radar data scattered by the field probe during pivoting of the field probe; and
    determining a field distribution along the elongated rigid body of the field probe from the return radar data to determine characteristics of the RCS test range.

2. The method of claim 1, wherein pivoting the field probe in the vertical direction comprises pivoting the field probe through a predetermined angle from a vertical broadside position to the incident radar waves to translate the field probe a selected distance up range and down range in the RCS test range.

3. The method of claim 2, wherein the predetermined angle is about ±5 degrees from the vertical position.

4. The method of claim 1, further comprising performing a Fast Fourier Transform of the return radar data to determine the field distribution along the elongated body.

5. The method of claim 1, further comprising determining if the pivoting of the field probe was uniformly smooth for measuring the return radar data at equal incremental movements of the field probe.

6. The method of claim 5, further comprising re-sampling the return radar data in equal steps in response to the pivoting of the field probe being determined to not be uniformly smooth.

7. A method for determining characteristics of a RCS test range, comprising:
    suspending an elongated vertical field probe at a predetermined location within the RCS test range, wherein the elongated vertical field probe is pivotable in a direction substantially parallel to a direction of travel of incident radar waves and wherein the elongated vertical field probe is free at one end to pivot;
    generating incident radar waves at a selected frequency and polarization;
    pivoting the elongated vertical field probe in the direction substantially parallel to the direction of travel of the incident waves;
    sensing a distance of travel of a predetermined point on the elongated vertical field probe from a zero degree vertical pivot angle as the elongated vertical field probe is pivoted through a predetermined range of motion;

receiving return radar information from the elongated vertical field probe as the elongated vertical field probe is pivoted through the predetermined range of motion; and determining characteristics of the RCS test range based on the received return radar information.

8. The method of claim 7, further comprising determining an intensity of the incident radar waves along the elongated vertical field probe.

9. The method of claim 7, further comprising performing a Fast Fourier Transform to determine characteristics of the RCS test range.

10. The method of claim 7, wherein suspending an elongated vertical field probe comprises:

attaching one end of a rope to an elevated member or ceiling of the RCS test range; and attaching a weight to an opposite end of the rope to prevent the rope from flexing and to maintain the rope as a straight rigid body, wherein at least a portion of the rope defines the elongated vertical field probe.

11. The method of claim 10, wherein pivoting the elongated vertical field probe comprises:

moving the weight in one direction parallel to the direction of travel of the incident waves by pulling on a first string and a second string attached to the weight from one side of the elongated vertical field probe and extending a third string and a fourth string attached to the weight from an opposite side of the field probe; and moving the weight in an opposite direction parallel to the direction of travel of the incident waves by pulling on the third and fourth strings and extending the first and second strings.

12. The method of claim 7, wherein suspending the elongated vertical field probe comprises:

extending a rope through an elongated metal rod;

attaching one end of a rope to an elevated member or ceiling of the RCS test range; and attaching a weight to an opposite end of the rope, wherein the elongated metal rod is retained in a selected location between the one end of the rope and the weight for scattering the incident radar waves.

13. The method of claim 7, further comprising:

determining if the pivoting motion of the elongated vertical field probe was uniformly smooth or steady, or determining if data points of the return radar information were measured in equal uniform steps or incremental distances along the predetermined range of motion; and re-sampling the return radar information in response to the pivoting motion of the elongated field probe being determined to not have been uniformly smooth or steady or in response to determining the data points of the return radar information were not measured in equal uniform steps or increments along the predetermined range of motion.

14. The method of claim 13, wherein re-sampling the return radar information comprises interpolating the return radar information by one of linear interpolation and spline interpolation.

15. A system for determining characteristics of a RCS test range, comprising:

a field probe including an elongated rigid body vertically oriented at a predetermined location within the RCS range, wherein the field probe is free at one end to pivot;

a device for pivoting the field probe in a vertical direction broadside to incident radar waves within the RCS range;

a receiver for receiving return radar data scattered by the field probe as the field probe is pivoted; and an apparatus for determining a field distribution along the elongated rigid body of the field probe from the return radar data scattered by the field probe.

16. The system of claim 15, wherein the field probe comprises a rope, the rope being attached at one end to an elevated member or ceiling of the RCS test range and the rope being attached at an opposite end to a weight to prevent the rope from flexing and to maintain the rope in a form of the elongated rigid body.

17. The system of claim 15, wherein the field probe comprises: an elongated metallic rod; and a rope extending through the elongated metal rod, wherein one end the rope is attached to an elevated member or ceiling of the RCS test range and an opposite end of the rope is attached to a weight, the elongated metallic rod being held in a selected location between the one end of the rope and the weight for scattering the incident radar waves.

18. The system of claim 17, wherein the device for pivoting the field probe comprises:

a first string and a second string attached to the weight and extending from one side of the field probe; and a third string and a fourth string attached to the weight and extending from an opposite side of the field probe, wherein the field probe is moved in one direction parallel to a direction of travel of the incident radar waves by pulling on the first and second strings and extending or releasing the third and fourth strings, and the field probe is moved in an opposite direction parallel to the direction of travel of the incident radar waves by pulling on the third and fourth strings and extending or releasing the first and second strings.

19. The system of claim 15, wherein the apparatus for determining the field distribution along the elongated body of the field probe comprises a module for performing a Fast Fourier Transform on the return radar data scattered by the field probe to provide the field distribution along the elongated body of the field probe.

20. The system of claim 15, further comprising a module to determine if the pivoting of the field probe was uniformly smooth for measuring the return radar data at equal incremental movements of the field probe and to re-sample the return radar data in equal steps in response to the pivoting of the field probe not being uniformly smooth.

* * * * *